(12) United States Patent
Lee et al.

(10) Patent No.: US 7,935,971 B2
(45) Date of Patent: May 3, 2011

(54) LIGHT EMITTING DIODE MODULE

(75) Inventors: Min Sang Lee, Gyeonggi-do (KR); Tae Hong Lee, Seoul (KR); Won Hoe Koo, Seoul (KR); Kyung Seob Oh, Incheon-si (KR)

(73) Assignee: Samsung Led Co. Ltd., Gyunggi-Do (KR)

( * ) Notice: Subject to any disclaimer, the term of this patent is extended or adjusted under 35 U.S.C. 154(b) by 0 days.

(21) Appl. No.: 12/330,968

(22) Filed: Dec. 9, 2008

(65) Prior Publication Data

US 2010/0044742 A1 Feb. 25, 2010

(30) Foreign Application Priority Data

Aug. 20, 2008 (KR) .................. 10-2008-0081212

(51) Int. Cl.
*H01L 27/15* (2006.01)
(52) U.S. Cl. ........ 257/81; 257/88; 257/89; 257/E33.062
(58) Field of Classification Search .................... 257/81, 257/88, 89, E33.062
See application file for complete search history.

(56) References Cited

U.S. PATENT DOCUMENTS

| 2004/0248332 A1* | 12/2004 | Yoon ................ 438/29 |
| 2006/0215405 A1* | 9/2006 | Jung et al. ............ 362/249 |
| 2009/0201699 A1* | 8/2009 | Ohno ................ 362/634 |

FOREIGN PATENT DOCUMENTS

| KR | 10-2007-0089393 A | 8/2007 |
| KR | 10-2007-0093769 A | 9/2007 |

* cited by examiner

*Primary Examiner* — Evan Pert
*Assistant Examiner* — Hajar Kolahdouzan
(74) *Attorney, Agent, or Firm* — McDermott Will & Emery LLP

(57) ABSTRACT

The present invention relates to a light emitting diode module capable of facilitating the connection between light emitting diode modules.

The present invention provides a light emitting diode module including an insulating layer, a first circuit pattern layer and a second circuit pattern layer which are stacked on a top surface and a bottom surface of the insulating layer respectively and have one ends protruding to an outside of the insulating layer and the other ends positioned inside the insulating layer, a solder resist layer coated on the first circuit pattern layer, a first via formed vertically through a portion of the solder resist layer to be electrically connected to the first circuit pattern layer, a second via formed vertically through a portion of the solder resist layer and the insulating layer to be electrically connected to the second circuit pattern layer and a light emitting element mounted on the solder resist layer.

10 Claims, 2 Drawing Sheets

[FIG. 1a]
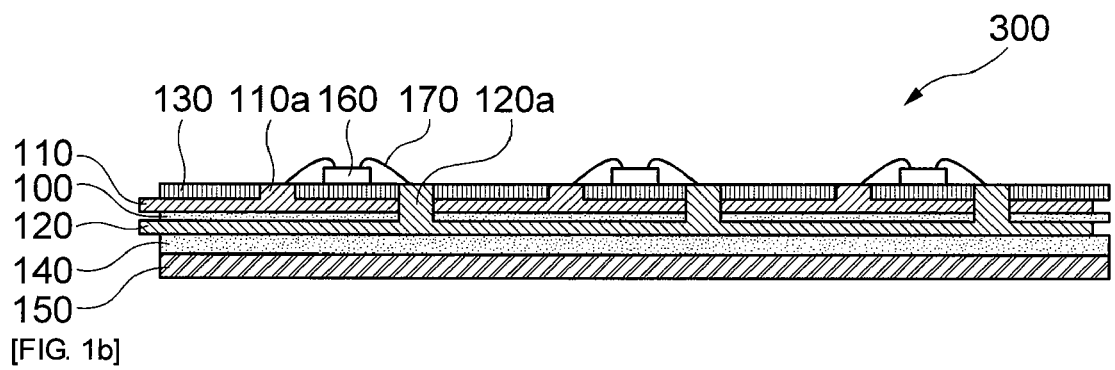
[FIG. 1b]
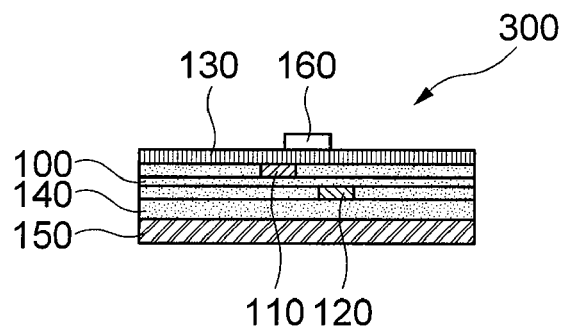
[FIG. 2]
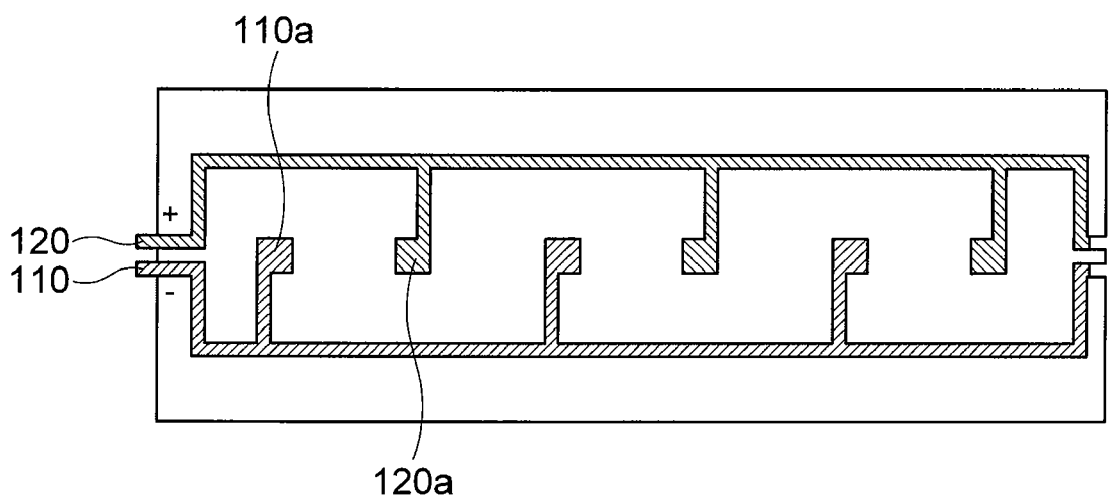

[FIG. 3]
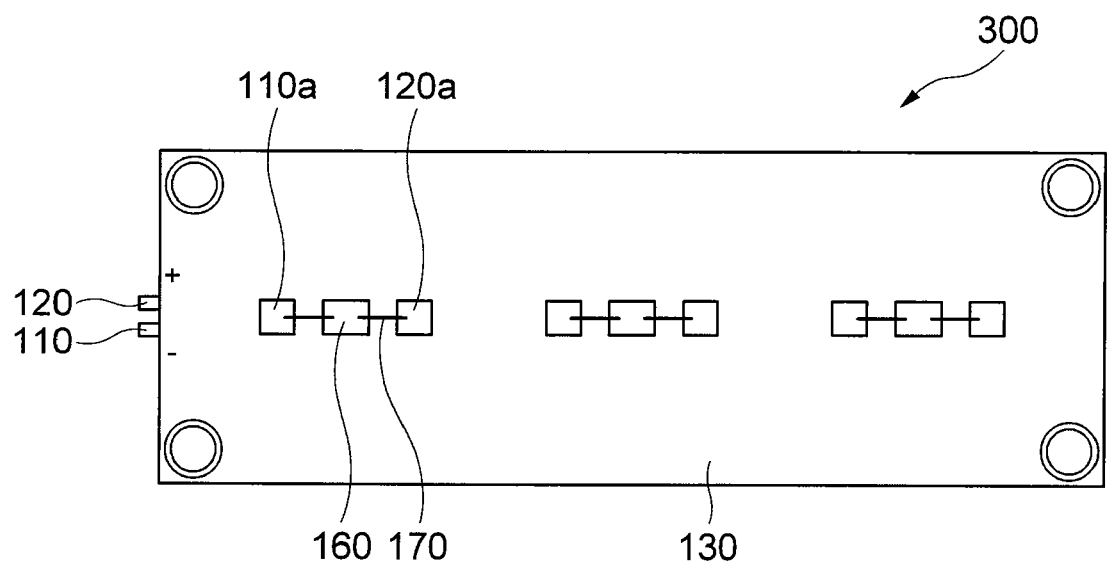
[FIG. 4]
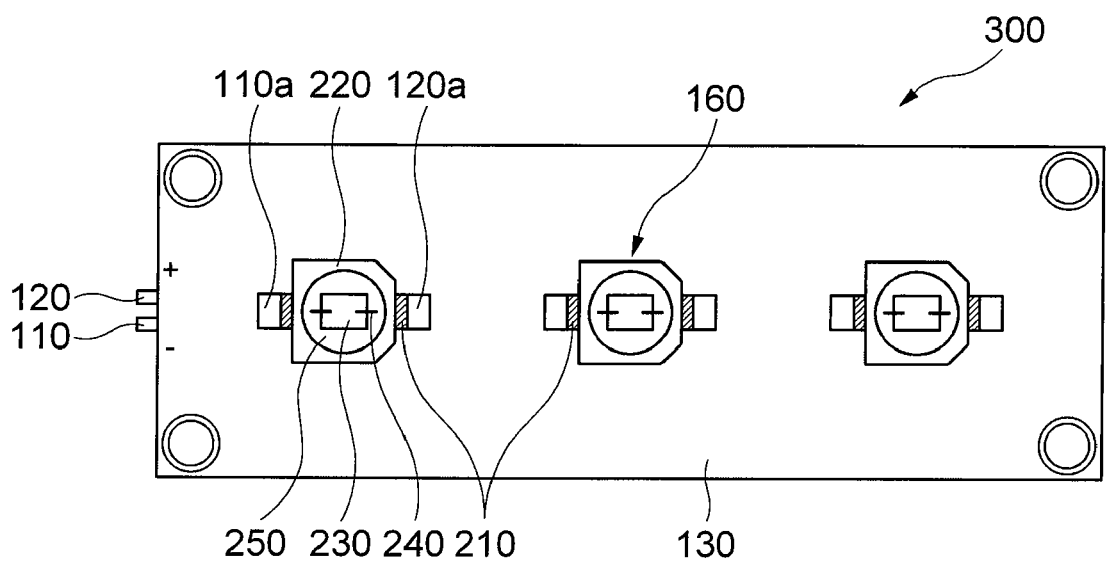

LIGHT EMITTING DIODE MODULE

CROSS-REFERENCE TO RELATED APPLICATIONS

This application claims the benefit of Korean Patent Application No. 10-2008-0081212 filed with the Korea Intellectual Property Office on Aug. 20, 2008, the disclosure of which is incorporated herein by reference.

BACKGROUND OF THE INVENTION

1. Field of the Invention

The present invention relates to a light emitting diode module; and, more particularly, to a light emitting diode module to protrude one end of each circuit pattern layer stacked on both surfaces of an insulating layer outward.

2. Description of the Related Art

A light emitting diode (hereinafter, referring to as "LED"), as a diode that emits light when a current flows, indicates a light emitting element in which when injecting minor carriers to a pn junction surface of a semiconductor, an electron is excited to a high energy level and energy obtained when returning to a stable state is converted into an electromagnetic wave with a wavelength range of light to be radiated.

Recently, the LED device in comparison with a general-purpose product with low brightness can be produced with high brightness and high quality due to rapid development of a semiconductor technology. In addition, as a blue and white LED with an excellent characteristic has been implemented, an application range of the LED has been broadened to a next-generation illumination source, various kinds of display devices, and so on.

An LED module is formed at a predetermined size by bonding one or a plurality of LEDs and constitutes the various kinds of display devices, an electric signboard of an image device, and so on.

A conventional LED module is manufactured by mounting what is inserted or mounted into or on a PCB (Printed Circuit Board), various shape keeping materials or the like to a main PCB again or by manufacturing one module by arranging and mounting LEDs on the PCB with a predetermined size and mounting a driver for controlling the LEDs and then connecting each of the modules to a controller with a cable by fixing the module through an outer case.

Meanwhile, the above-mentioned conventional LED module can be applied to the various display devices, the electric signboard of the image device, and so on by being formed at the predetermined size by bonding the one or the plurality of LEDs, however, a manufacture process thereof was complicated, that is, a type of a driving circuit should be changed according to connection between the modules and various driving circuits appropriate to various types of modules was needed by connecting the modules through an electric wire after attaching a connector to each of the modules.

SUMMARY OF THE INVENTION

The present invention has been invented in order to overcome the above-described problems and it is, therefore, an object of the present invention to provide a light emitting diode module capable of facilitating connection between light emitting diode modules without attaching an additional connector by directly connecting circuit pattern layers stacked in a substrate.

In accordance with an embodiment of the present invention to achieve the object, there is provided a light emitting diode module including an insulating layer; a first circuit pattern layer and a second circuit pattern layer which are stacked on a top surface and a bottom surface of the insulating layer respectively and have one ends protruding to an outside of the insulating layer and the other ends positioned inside the insulating layer; a solder resist layer coated on the first circuit pattern layer; a first via formed vertically through a portion of the solder resist layer to be electrically connected to the first circuit pattern layer; a second via formed vertically through a portion of the solder resist layer and the insulating layer to be electrically connected to the second circuit pattern layer; and a light emitting element mounted on the solder resist layer.

Herein, the first circuit pattern layer and the second circuit pattern layer may have different polarities from each other.

And, the first circuit pattern layer and the second circuit pattern layer may be made of a copper foil.

Further, the light emitting element may be positioned between the first via and a second via.

Further, the light emitting element may be mounted in a chip or package type and if the light emitting element is mounted in the chip type, the light emitting element may be electrically connected to top surfaces of the first via and the second via through wires.

Further, if the light emitting element is mounted in the package type, the light emitting element may include a pair of lead frames electrically connected to the first via and the second via respectively; a package mold including a molding material filling space while receiving a portion of the lead frames inside; a light emitting chip mounted on the lead frames inside the package mold; and a molding material to protect the light emitting chip by being filled inside the package mold.

Further, the light emitting diode module may include a second insulating layer and a heat discharge plate sequentially stacked on a bottom surface of the second circuit patter layer.

Further, the heat discharge plate may be made of aluminum.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1a and FIG. 1b are a cross-sectional view and a side view showing a structure of a light emitting diode module in accordance with an embodiment of the present invention;

FIG. 2 is a plane-view showing a circuit pattern layer of the light emitting diode module in accordance with the embodiment of the present invention; and FIG. 3 and FIG. 4 are plane-views showing a structure of the light emitting diode module in accordance with the embodiment of the present invention.

DETAILED DESCRIPTION OF THE PREFERABLE EMBODIMENTS

Hereinafter, a matter regarding to an operation effect including a technical configuration to achieve the object of a light emitting diode module in accordance with the present invention will be clearly appreciated through the following detailed description with reference to the accompanying drawings illustrating preferable embodiment of the present invention.

Hereinafter, a light emitting diode module in accordance with an embodiment of the present invention will be described in detail with reference to FIG. 1 to FIG. 4.

FIG. 1a and FIG. 1b are a cross-sectional view and a side view showing a structure of a light emitting diode module in accordance with an embodiment of the present invention, FIG. 2 is a plane-view showing a circuit pattern layer of the light emitting diode module in accordance with the embodiment of the present invention and FIG. 3 and FIG. 4 are plane-views showing a structure of the light emitting diode module in accordance with the embodiment of the present invention.

First of all, as shown in FIG. 1a and FIG. 1b, in accordance with the embodiment of the present invention, a light emitting diode module 300 includes a first insulating layer 100, a first circuit pattern layer 110 stacked on a top surface of the first insulating layer 100, a second circuit pattern layer 120 stacked on a bottom surface of the first insulating layer 100, a solder resist layer 130 coated on the first circuit pattern layer 110 and light emitting elements 160 mounted on the solder resist layer 130.

On a bottom surface of the second circuit pattern layer 120, a second insulating layer 140 and a heat discharge plate 150 are sequentially stacked. Herein, it is preferable that the heat discharge plate 150 is made of metal with high heat discharge efficiency such as aluminum (Al) to improve the heat discharge efficiency.

The first insulating layer 100 and the first and second circuit pattern layers 110 and 120 stacked on both surfaces thereof may be a CCL (Copper Clad Laminate).

The CCL, as a master plate on which a printed circuit board is generally manufactured, is a laminate formed by coating the both surfaces of the insulating layer 100 with copper coils as the first and second circuit pattern layers 110 and 120 and there are several CCLs such as a glass/epoxy CCL, a heat-resistant resin CCL, a paper/phenol CCL, a high frequency CCL, a flexible CCL (polyimide film) and a composite CCL according to a use thereof. Among these, the glass/epoxy CCL is mainly used in manufacturing a double-sided printed circuit board, and a multi-layer printed circuit board, and so on.

The glass/epoxy CCL is made of a reinforcement substrate formed by penetrating epoxy resin to a glass fiber and the copper foil. The glass/epoxy CCL is classified according to the reinforcement substrate, wherein generally, it is graded FR-1 to FR-5 according to the reinforcement substrate and heat-resistance under a specification established by NEMA (National Electrical Manufacturers Association). The FR-4 among these grades has been most widely used, however, recently, demand for the FR-5 with an improved a glass transition temperature (Tg) characteristic of resin is rising.

Particularly, in the light emitting diode module 300 in accordance with the embodiment of the present invention, it is preferable that one ends of the first circuit pattern layer 110 and the second circuit pattern layer 120, as shown in FIG. 2, protrude to an outside of the first insulating layer 100 and the other ends thereof are positioned inside the first insulating layer 100.

And, it is preferable that the first circuit pattern layer 110 and the second circuit pattern layer 120 respectively formed on the both surfaces of the first insulating layer 100 have different polarities from each other.

For example, if the first circuit pattern layer 110 is a negative pole, the second circuit pattern layer 120 may be a positive pole, and vice versa, if the first circuit pattern layer 110 is the positive pole, the second circuit pattern layer 120 may be the negative pole.

In accordance with the embodiment of the present invention, the connection between the light emitting diode modules 300 is achieved by inserting the one ends of the first and second circuit pattern layers 110 and 120 protruding to the outside of the CCL into the other ends of the first and second circuit pattern layers 110 and 120 positioned inside the first insulating layer 100 of the other light emitting diode module 300 to be directly connected to each other.

At this time, positions of the one ends and the other ends of the first and second circuit pattern layers 110 and 120 may be variously changed in designing circuits of the first and second circuit pattern layers 110 and 120.

Therefore, in accordance with the embodiment of the present invention, in the connection between the LED modules 300, it is possible to facilitate expansion connection between the modules by using the reference LED module 300 without attaching an unnecessary connector by directly connecting the first and second circuit pattern layers 110 and 120 with the different polarities stacked in the substrate mounting the light emitting elements 160 to the first and second circuit pattern layers 110 and 120 of the other module in series or in parallel.

At the CCL of the LED module 300, that is, the solder resist layer 130 coated on an upper part of the first insulating layer 100 stacked with the first and second circuit pattern layers 110 and 120 on the both surfaces, a first via 110a is formed vertically through a portion of the solder resist layer 130 to be electrically connected to the first circuit pattern layer 110.

Further, the LED module 300 in accordance with the present embodiment includes a second via 120a which is formed vertically through a portion of the solder resist 130 where the first via 110a is not formed and a portion of the first insulating layer 100 to be electrically connected to the second circuit pattern layer 120.

The first via 110a is formed to be electrically connected to the first circuit pattern layer 110 by coating the solder resist layer 130 on the first insulating layer 100 stacked with the first and second circuit pattern layers 110 and 120 on the both surfaces, removing a portion of the solder resist layer 130 to form a first via hole (not shown in drawings) exposing a top surface of the first circuit pattern layer 110, and then plating an inside of the first via hole.

Further, the second via 120a is formed to be electrically connected to the second circuit pattern layer 110 by removing a portion of the solder resist layer 130 and the first insulating layer 100 to form a second via hole (not shown in the drawings) exposing a top surface of the second circuit pattern layer 120 and then plating an inside of the second via hole.

And, the light emitting element 160 may be electrically connected to the first via 110a and the second via 120a by being positioned therebetween.

Herein, the light emitting element 160 may be mounted in a chip or package type.

If the light emitting element 160 is mounted in the chip type, as shown in FIG. 3, it is electrically connected to top surfaces of the first via 110a and the second via 120a through wires 170. At this time, the wires 170 may be made of gold (Au) or the like.

And, if the light emitting element 160 is mounted in the package type, as shown in FIG. 4, the light emitting element 160 may include a pair of lead frames 210 electrically connected to the first via 110a and the second via 120a respectively, a package mold 220 including a molding material filling space while receiving a portion of the lead frames 210 inside, a light emitting chip 230 mounted on the lead frame 210 inside the package mold 220 and a molding material 250 to protect the light emitting chip 230 by being filled inside the package mold 220.

The light emitting chip 230 may be electrically connected to the lead frames 210 through the wires 240.

The molding material 250 may be made of light-transmitting resin with a high light transmitting property such as silicon resin and epoxy resin according to a color of the light emitting chip 230 to be implemented. Further, the molding material 250 may be made of the light transmitting resin mixed with a fluorescent substance which plays a role of absorbing light with a specific wavelength generated and emitted from the light emitting chip 230 and converting it into light with another wavelength.

As described above, in accordance with the present invention, the light emitting diode module is capable of directly connecting the one ends of the first and second circuit pattern layers protruding to the outside of the LED module to the other ends of the first and second circuit pattern layers positioned inside the insulating layer of the other LED module by projecting the one ends of the first and second circuit pattern layers stacked on the both surfaces of the insulating layer toward the outside of the insulating layer and positioning the other ends thereof inside the insulating layer.

Accordingly, in accordance with the present invention, in the connection between the LED modules, it is possible to facilitate the expansion connection between the LED modules without attaching an additional connector to the modules by directly connecting the first and second circuit pattern layers with the different polarities stacked in the substrate mounting the light emitting element to the first and second circuit pattern layers of the other LED module in series or in parallel.

As described above, although the preferable embodiments of the present invention has been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:

1. A light emitting diode module comprising:
   an insulating layer;
   a first circuit pattern layer and a second circuit pattern layer which are stacked on a top surface and a bottom surface of the insulating layer respectively and include one ends protruding to an outside of the insulating layer and the other ends positioned inside the insulating layer;
   a solder resist layer coated on the first circuit pattern layer;
   a first via formed vertically through a portion of the solder resist layer to be electrically connected to the first circuit pattern layer;
   a second via formed vertically through a portion of the solder resist layer and the insulating layer to be electrically connected to the second circuit pattern layer; and
   a light emitting element mounted on the solder resist layer, wherein
   parts of the first and second vias are exposed through the solder resist layer, provided as an electrical connection terminal, and
   the first and second vias are electrically insulated from each other, and are electrically connected to the first and second circuit patterns, respectively.

2. The light emitting diode module of claim 1, wherein the first circuit pattern layer and the second circuit pattern layer include different polarities from each other.

3. The light emitting diode module of claim 1, wherein the first circuit pattern layer and the second circuit pattern layer are made of copper foils.

4. The light emitting diode module of claim 1, wherein the light emitting element is positioned between the first via and a second via.

5. The light emitting diode module of claim 1, wherein the light emitting element is mounted in a chip or package type.

6. The light emitting diode module of claim 5, wherein if the light emitting element is mounted in the chip type,
   the light emitting element is electrically connected to top surfaces of the first via and the second via through wires.

7. The light emitting diode module of claim 5, wherein if the light emitting element is mounted in the package type,
   the light emitting element includes:
   a pair of lead frames electrically connected to the first via and the second via respectively;
   a package mold including a molding material filling space while receiving a portion of the lead frames inside; and
   a light emitting chip mounted on the lead frames inside the package mold,
   wherein the molding material protects the light emitting chip by being filled inside the package mold.

8. The light emitting diode module of claim 1, further comprising:
   a second insulating layer and a heat discharge plate sequentially stacked on a bottom surface of the second circuit patter layer.

9. The light emitting diode module of claim 8, wherein the heat discharge plate is made of aluminum.

10. The light emitting diode module of claim 1, further comprising:
    a plurality of the light emitting elements which are connected in parallel.

* * * * *